(12) United States Patent
Fisera et al.

(10) Patent No.: US 8,819,018 B2
(45) Date of Patent: Aug. 26, 2014

(54) VIRTUAL SUB-METERING USING COMBINED CLASSIFIERS

(75) Inventors: Radek Fisera, Prague (CZ); Karel Macek, Prague (CZ); Jiri Rojicek, Prague (CZ)

(73) Assignee: Honeywell International Inc., Morristown, NJ (US)

( * ) Notice: Subject to any disclaimer, the term of this patent is extended or adjusted under 35 U.S.C. 154(b) by 597 days.

(21) Appl. No.: 13/114,608

(22) Filed: May 24, 2011

(65) Prior Publication Data

US 2012/0303619 A1    Nov. 29, 2012

(51) Int. Cl.
*G06F 7/00* (2006.01)
*G06F 17/30* (2006.01)

(52) U.S. Cl.
USPC ......................................................... 707/737

(58) Field of Classification Search
USPC .............................. 707/737; 324/127; 702/61
See application file for complete search history.

(56) References Cited

U.S. PATENT DOCUMENTS

| | | | |
|---|---|---|---|
| 2011/0061015 A1 | 3/2011 | Drees et al. | |
| 2012/0290230 A1* | 11/2012 | Berges Gonzalez et al. ... | 702/61 |

FOREIGN PATENT DOCUMENTS

| | | |
|---|---|---|
| GB | 2471536 A | 1/2011 |
| WO | WO-2011/002735 A1 | 1/2011 |

OTHER PUBLICATIONS

"European Application Serial No. 12167522.7, Response filed May 22, 2013 to Office Action mailed Jan. 17, 2013", 17 pgs.
"European Application Serial No. 12167522.7, European Search Report mailed Aug. 30, 2012", 4 pgs.
Chang, Hsueh-Hsien, et al., "Load Recognition for Different Loads with the Same Real Power and Reactive Power in a Non-intrusive Load-monitoring System", *12th International Conference on Computer Supported Cooperative Work in Design (CSCWD 2008)*, (2008), 1122-1127.
"European Application Serial No. 12167522.7, Office Action mailed Jan. 17, 2013", 5 pgs.

* cited by examiner

*Primary Examiner* — Alexey Shmatov
(74) *Attorney, Agent, or Firm* — Schwegman Lundberg & Woessner, P.A.

(57) ABSTRACT

A virtual sub-metering process using combined classifiers includes generating an electric power consumption signature database by receiving data from an electric power consumption measuring meter and auxiliary data from a building management system, and clustering the data. After the generation of the electric power consumption signature database, additional data from the electric power consumption measuring meter and the auxiliary data from the building management system is received, and this additional data is processed to generate a second steady-state load classification component. A second transient state component is extracted from the additional data. The steady-state load classification components and the transient shape components from the electric power consumption signature database, the second steady state load classification component, the second transient shape component, and control signals and status signals associated with the plurality of electric power consuming devices are correlated and combined.

20 Claims, 5 Drawing Sheets

VIRTUAL SUB-METERING USING COMBINED CLASSIFIERS

TECHNICAL FIELD

The present disclosure relates to a system and method relating to virtual sub-metering using combined classifiers.

BACKGROUND

Monitoring of overall building energy consumption with the ability to drill down to an individual electric appliance level is a desirable capability of Building Energy Management Systems (BEMS). Having the individual power consumptions of all (major) appliances substantially widens the possibilities and enables a number of new and useful functionalities, e.g. the performance monitoring of individual devices, fault detection and diagnostics, etc. Due to the large investment required for physical sub-meter installation (meters plus wiring and labor cost), NILM (Non-Invasive Load Monitoring) techniques have been receiving considerable attention in the research community for the past twenty years or so. These methods use just one meter that is placed somewhere in the building wiring hierarchy, and these meters estimate/disaggregate the power consumption of devices beyond this measurement point.

However, the results achievable with common instrumentation are not very reliable, and the advanced techniques promising higher reliability of the results still incur large costs (expensive proprietary hardware capable of fast sampling and digital signal processing). Low reliability is often caused by an algorithm's inability to distinguish among similar devices (e.g., several air-handling units of the same capacity from the same manufacturer). This is unfortunately very common in the commercial/public building environment.

DETAILED DESCRIPTION

Figure 1:
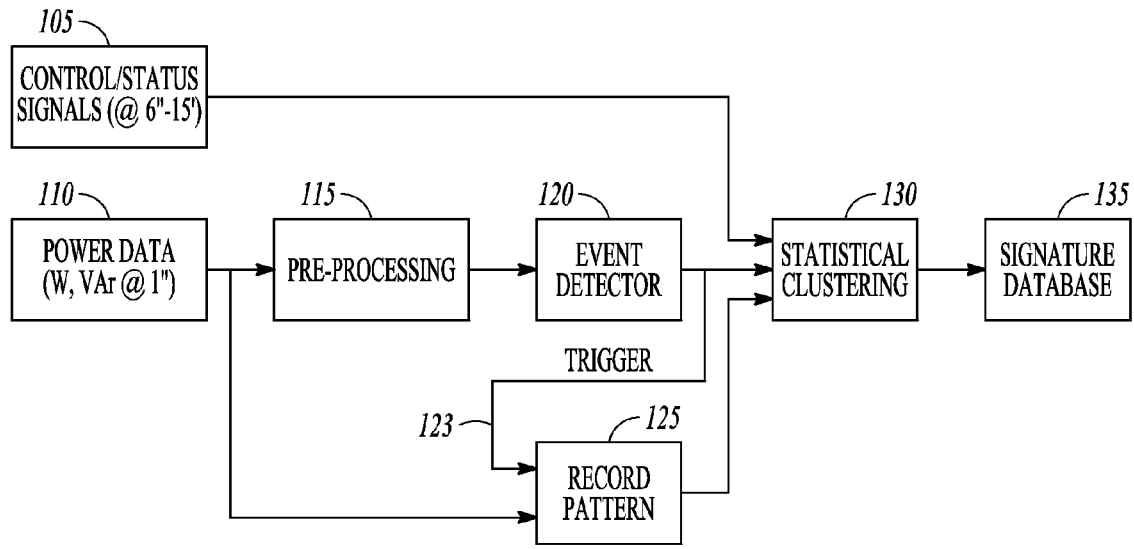
FIG. 1 is a block diagram of a system and method to create an automated signature database.

One or more embodiments improve the reliability of the above-mentioned techniques by leveraging all available and useful information inputs while maintaining the costs as low as possible. In an ideal case, only a software upgrade at a BAS (Building Automation System) supervisory controller would be required.

Two major concerns in this area, that is, the level of confidence in the results and the overall cost of the NILM, are addressed and a substantial improvement over the standard techniques is provided by one or more embodiments. Basically, an embodiment combines the soft information (probabilistic) from the outputs of the two known standard NILM techniques with the data from the building management system (control/status signals). While the independent hard outputs of these classical NILM approaches give quite unreliable results, their soft combination (including a back tracing algorithm based on control signals described herein) can readily outperforms them.

An embodiment operates in two modes. First, there is an Automated Signature Database Build (ASDB). The signature database is built automatically (with optional user inputs) once at the beginning, and whenever a device set is changed (device addition/removal/upgrade). Second, during normal operation of the building system, an online algorithm runs and outputs the disaggregated powers of the appliances with the delay equal to the control signal update period (near real-time), but with the time granularity given by the sampling frequency of the energy meter.

An embodiment exploits only inputs that are typically available in a commercial or public building. These are the outputs from the common energy meter (capable of reading the total real and reactive power within a one second period), and the data (control/status signals) that is collected by a building management system (BMS). In comparison to standard methods (steady state load classification, transient pattern analysis), an embodiment leverages the advantages of both of the standard methods and uses the information from available control signals in a joint manner (combined classifiers). This embodiment utilizes all related available diversified information inputs and combines these various views (in the form of probabilities=individual classifier soft decisions outputs) in an appropriate manner to get a final decision. This brings considerable improvement in terms of results reliability. Results are provided together with a level of confidence or reliability, which is evaluated based on the confidence of all individual classifiers. Moreover, cooperation of a user is minimal. While results are outputted, with some results their reliability varies according to the monitored set of devices and the availability and granularity of the control/status signals. An embodiment can work completely blindly without any user information or input. However, in such a case, the results are not as reliable. Any information from the user (e.g., number of devices, their nominal powers, etc.) results in an increase in the confidence of the output.

One or more embodiments can be deployed as follows. Electrical measurements (e.g., total (3 phase addition) real and reactive power) are collected at a rate in order of seconds (although a shorter time period is preferred). This measurement register update rate is achievable by the standard meter often already installed in the target building. Such a rate is sufficient for capturing building HVAC system events, and allows one to perform an informational and beneficial transient pattern analysis. Although commonly the power signals are sampled with much higher rates (milliseconds) for the transition pattern analysis, there is still some useful information that remains in a signal that is sampled with only a one second period (HVAC equipment turn on patterns can last for 15-20 seconds for example), and it can be used for contributing soft input in the combined classification.

Control signals for the devices beyond the measurement point are also collected. An embodiment accepts a subset of these signals because this is a typical situation, and also because various sampling periods are supported. The lower the sampling frequency, the lower will be the overall result reliability. There are also some additional inputs useful for the system that can increase the reliability/confidence of the outputs. However, these additional inputs are not mandatory. These additional inputs include the number of devices beyond the measurement point, the nominal power of each device, and the assignment of the signature to the particular device (i.e., a naming procedure).

The embodiments can function quite adequately even without costly installation of additional hardware because standard energy meters typically assembled at public and commercial buildings are capable of readings with a one second rate (usually are queried at substantially lower rate). It suffices only to change the data querying interval at the HW/SW platform that hosts the NILM. Control signals are typically already collected by BMS. It's only needed to convey the data at NILM input.

FIG. 1 illustrates in block diagram form the Automated Signature Database Build (ASDB). Referring to FIG. 1, all available control and status signals 105 for devices beyond a measurement point are obtained. The typical sampling period ranges from 6 seconds to 15 minutes. This data can be obtained from the building management system (BMS). Power data 110 is obtained from the energy meter. Total (3 phase) real and reactive powers are a sufficient reading for an embodiment. An achievable sampling period via a common meter is about 1 second. At 115, signals from the meter are preprocessed to remove unwanted features while at the same time maintaining the information content. The preprocessing improves the performance of subsequent steps in the process. The event detector 120 detects the signal events (that is, a device was turned ON/OFF). As noted at 123, these signal events trigger the recording of the turn-on patterns at 125. More specifically, at 125, the input signal is recorded whenever a trigger signal comes from the event detector. The turn-on pattern with sufficient time granularity (e.g., one second sampling) is captured for every turn-on event. At 130, all captured events as well as recorded patterns are statistically clustered to get the device signature. At this point, optional inputs such as the number of devices and nominal powers are useful but not required. At 135, when a sufficient amount of data is collected (normally takes about 2-3 weeks), the signatures are stored into the database 135. A user can be asked to provide names for the signatures.

Figure 2:
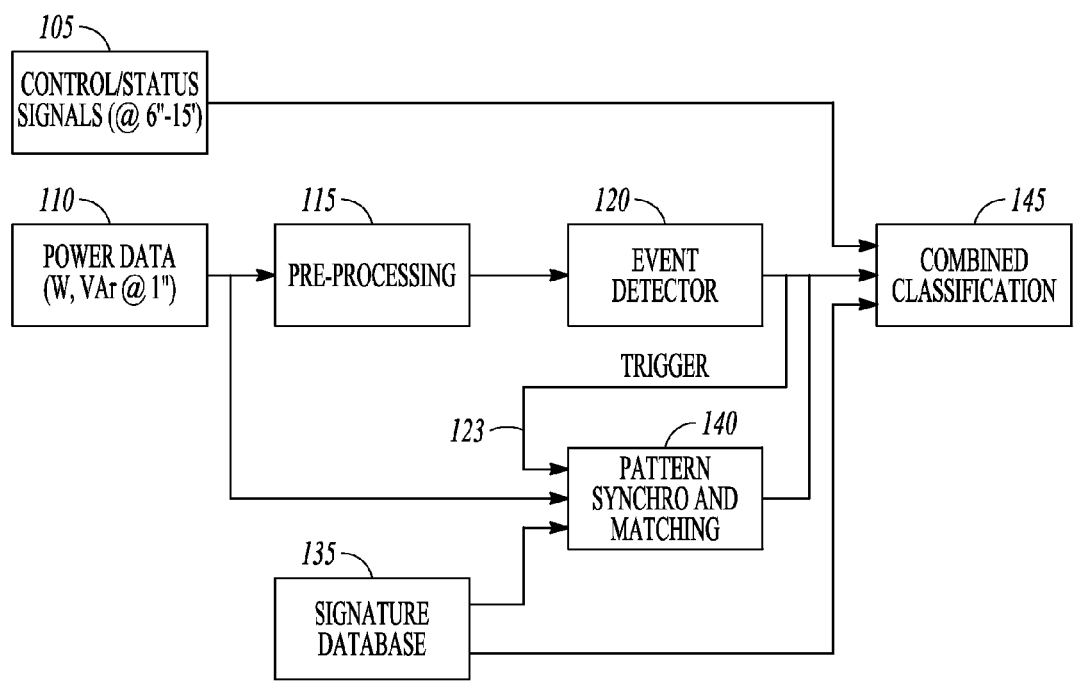
FIG. 2 is a block diagram of a online process of virtual sub-metering using combined classifiers.

FIG. 2 illustrates in block diagram form the online NILM algorithm. The control and status signals 105, the power data 110, the pre-processing 115, the event detector 120, the trigger 123, and the signature database 135 are the same as the ASDB of FIG. 1. The pattern and synchronized matching 145 synchronizes and trims the transient shapes captured during the NILM run so that these transient shapes are comparable with the patterns stored in the signature database 135. A result of this matching is a kind of soft information (probabilistic similarity measure) that is then passed to the combined classifier 145. The combined classifier 145 leverages the soft information inputs from the two standard NILM techniques together with the control and status signals 105 of the devices beyond the measurement point. As these signals are typically available with substantially lower granularity, the final decisions about events between subsequent control signal updates are outputted with the delay equal to the control signals sampling period (near real time).

A Gaussian classifier of events can be represented as follows:

| * Gaussian Classifier of Events | |
| --- | --- |
| x | output from the event detector |
| $m_i$ | cluster centroids |
| $\Sigma_i$ | covariance matrix |
| d | measurement dimensionality |
| $w_i$ | estimated event |

Gaussian Classifier of Events
x output from the event detector
$m_i$ cluster centroids
$\Sigma_i$ covariance matrix
d measurement dimensionality
$w_i$ estimated event $$p(x \mid w_i) = (2\pi)^{-\frac{d}{2}} \left| \sum_i \right|^{-\frac{1}{2}} e^{-(x-m_i)\Sigma_i^{-1}(x-m_i)}$$

$$P(w_i \mid x) = \frac{p(x \mid w_i) \cdot P(w_i)}{\sum_k p(x \mid w_k) \cdot P(w_k)}$$

Preceding operations on the signal are sampled at a 1 second rate. This is triggered by the pattern capturing 125 (e.g., by the signal from the event detector). There is also synchronization and sample length (d) adjustment (trimming) between the library pattern (stored signature $m_i$) and the captured shape X (using correlation for example).

A Gaussian classifier can further be represented by the following:

$$p(x \mid w_i) = (2\pi)^{-\frac{d}{2}} \left| \sum_i \right|^{-\frac{1}{2}} e^{-(x-m_i)\Sigma_i^{-1}(x-m_i)}$$

A priori probabilities about the event $w_i$ are optional.

$$P(w_i \mid x) = \frac{p(x \mid w_i) \cdot P(w_i)}{\sum_k p(x \mid w_k) \cdot P(w_k)}$$

Classifiers can be combined in several ways. One way that they can be combined is via the product rule. This assumes the independence of two points of view (two classifiers). Another way that they can be combined is the summation rule. This assumes that the posteriori probabilities $P(\omega_i | X)$ do not differ too much from prior probabilities $P(\omega_i)$. The Summation rule is less sensitive but more robust. So, the information from the control and status signals 105 is propagated backwards to finalize the classification of events that were detected from the last update to the present time. This back tracking is illustrated in FIG. 3.

Figure 3:
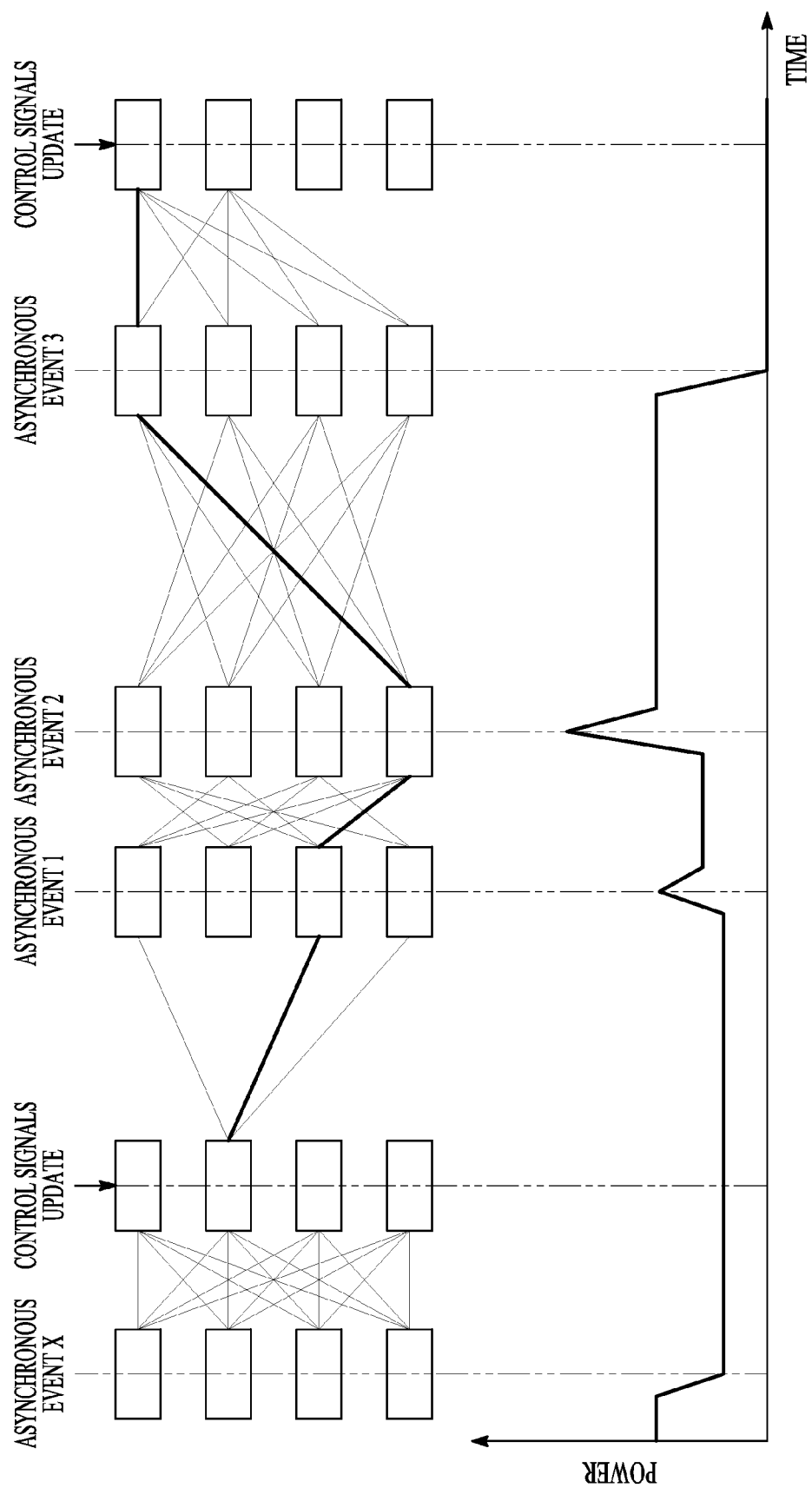
FIG. 3 is a graph illustrating a back tracking algorithm.

FIG. 3 illustrates the backtracking (or backtracing) algorithm that propagates the recent information from the control signals back in time and supports the events classification between current and recent control signals update. The information from the BMS about the control/status signals is considered as highly reliable, and it basically enables substantial trellis pruning—that is, only trajectories that end in states allowed by current control signals are further evaluated. There can be more than one end state because of potential incompleteness of control/status signals. The simple example depicted in FIG. 3 considers just two devices beyond the measurement point, which results in four achievable states at each instance. These states are represented by rectangular boxes. When any event happens, the system performs a transition from one state to another (transitions to the same state are not allowed). There are two ending states in the example of FIG. 3 because a control signal for one device out of two is available. The backtracing algorithm evaluates overall (using the summation, product, or other combination rule) probability of the allowed trajectories. Finally, the most probable path is chosen according to selected rule. This determines all events classification between current and recent control signal update instances.

Figure 4A:
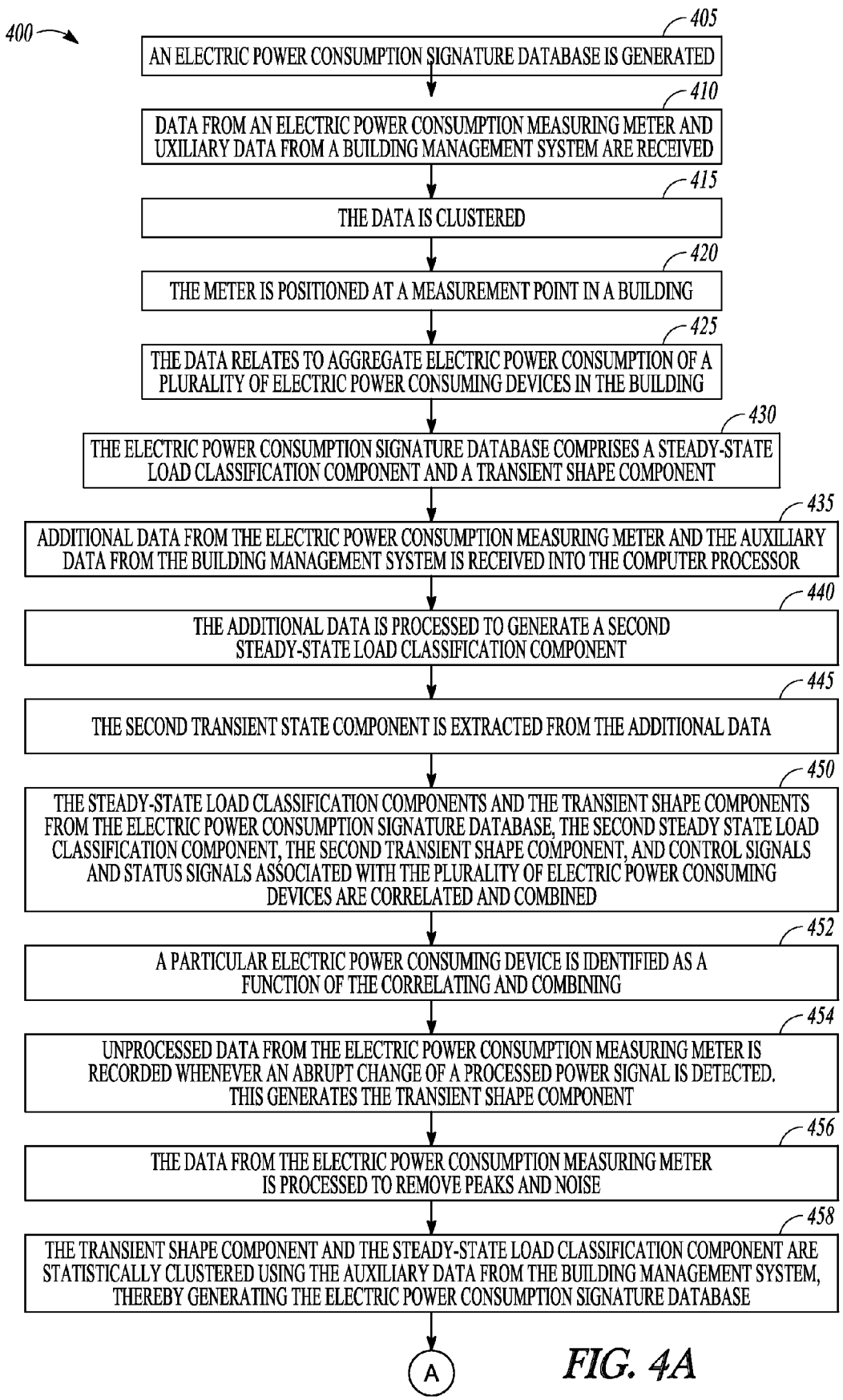
FIGS. 4A and 4B are a flowchart illustrating a virtual sub-metering process using combined classifiers.
Figure 4B:
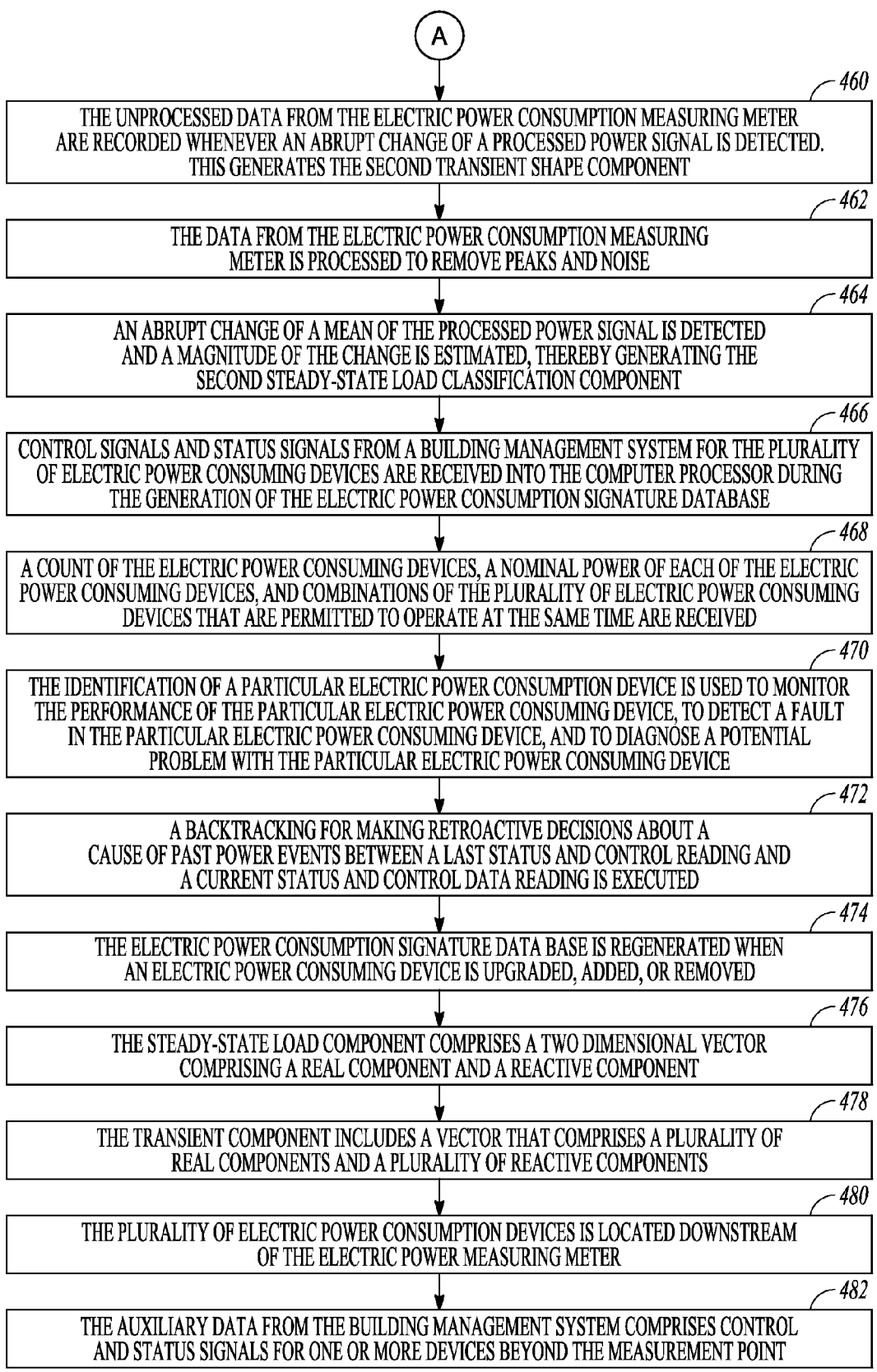

FIGS. 4A and 4B are a flowchart of an example process 400 for virtual sub-metering using combined classifiers. FIGS. 4A and 4B include a number of process blocks 405-482. Though arranged serially in the example of FIGS. 4A and 4B, other examples may reorder the blocks, omit one or more blocks, and/or execute two or more blocks in parallel using multiple processors or a single processor organized as two or more virtual machines or sub-processors. Moreover, still other examples can implement the blocks as one or more specific interconnected hardware or integrated circuit modules with related control and data signals communicated between and through the modules. Thus, any process flow is applicable to software, firmware, hardware, and hybrid implementations.

Referring now specifically to FIGS. 4A and 4B, at 405, an electric power consumption signature database is generated. The generation of this signature database is further detailed in blocks 410 and 415. At 410, data from an electric power consumption measuring meter and auxiliary data from a building management system are received into a computer processor. At 415, the data is clustered. The clustering involves several steps as illustrated in block 420, 425, and 430. At 420, the meter is positioned at a measurement point in a building. At 425, the data relates to aggregate electric power consumption of a plurality of electric power consuming devices in the building, and at 430, the electric power consumption signature database comprises a steady-state load classification component and a transient shape component.

After the generation of the electric power consumption signature database in blocks 405-430, at 435, additional data from the electric power consumption measuring meter and the auxiliary data from the building management system is received into the computer processor. At 440, the additional data is processed to generate a second steady-state load classification component. At 445, a second transient state component is extracted from the additional data. At 450, the steady-state load classification components and the transient shape components from the electric power consumption signature database, the second steady state load classification component, the second transient shape component, and control signals and status signals associated with the plurality of electric power consuming devices are used for evaluation of the soft metric (probabilistic) which then supports the decision about the device that has caused the recently detected event.

At 452, a particular electric power consuming device is identified as a function of the correlating and combining. The particular electric power consuming device has caused a recent detected event in connection with this identification process. The identification process is performed sequentially during the online run of the algorithm, and it results in a disaggregated time series of power consumption of devices beyond the measurement point. The decisions about which devices have caused the recent sequence of events are made at the rate that the control and status signals 105 are coming from the BMS. As this rate (BMS data reading frequency) is typically much lower than the electrical data reading rate (e.g., 1 second), the decisions are performed retroactively for all detected events between the current control signals and the last sample of the control signals. For example, if the data came within a 15 minute period, there could be ten or even more power events between the current and the last reading. These decisions are produced by the backtracking algorithm.

The generation of the electric power consumption signature database comprises several steps. Specifically, at 454, unprocessed data from the electric power consumption measuring meter is recorded whenever an abrupt change of a processed power signal is detected. An example implementation can be a FIFO buffer whose content is captured on the trigger from the event detector. This, after suitable normalization, generates the transient shape component. A normalization (can be a simple removal of the offset given by the signal value before the given event) is needed to make stored signal samples comparable. At 456, the data from the electric power consumption measuring meter is processed to remove peaks and noise. The removal of peaks and noise improves the performance of a successive event detector that generates the steady-state load classification component. At 458, the transient shape component and the steady-state load classification component are statistically clustered using the auxiliary data from the building management system, thereby generating the electric power consumption signature database.

The generation of the second steady-state load classification component and the second transient shape component involves a couple of steps. At 460, the unprocessed data from the electric power consumption measuring meter are recorded whenever an abrupt change of a processed power signal is detected. This generates, after suitable normalization, the second transient shape component. At 462, the data from the electric power consumption measuring meter is processed to remove peaks and noise. At 464, an abrupt change of a mean of the processed power signal is detected and a magnitude of the change is estimated, thereby generating the second steady-state load classification component.

At 466, control signals and status signals from a building management system for the plurality of electric power consuming devices are received into the computer processor during the generation of the electric power consumption signature database. The control and status signals comprise one or more of an indication when a device is turned on and turned off. In an embodiment, the indication can include a number from the interval <0, 1> or <0,100>. At 468, a count of the electric power consuming devices, a nominal power of each of the electric power consuming devices, and combinations of the plurality of electric power consuming devices that are permitted to operate at the same time are received into the computer processor. It should be noted that this information is not mandatory. However, if this information is available it can improve the performance. The algorithm is able to produce results with decreased accuracy (reliability) even without having this supplementary information.

At 470, the identification of a particular electric power consumption device is used to monitor the performance of the particular electric power consuming device, to detect a fault in the particular electric power consuming device, and to diagnose a potential problem with the particular electric power consuming device. Disaggregated power consumption can reveal the biggest energy consumers to the facility managers and optionally suggest some energy conservation actions. At 472, a backtracking for making retroactive decisions about a cause of past power events between a last status and control reading and a current status and control data reading is executed. As the number of devices beyond the measurement point is limited and obviously dependent on the particular meter placement in the building, the system is described by a vector of device status signals. If there is no constraint, the number of combinations is quite large ($2^N$). Each combination represents a possible status of the system. During the forward run of the algorithm, the states are assigned with the measure that indicates the probability that the system (set of devices beyond the measurement point) is in this particular state. This assignment is done based on an evaluation of the similarity measure of currently captured events with all signatures in the signature database. As a result, some of the states, or even just one in a best case, are marked as very probable and the rest are marked as less probable. This assessment is done after detecting every single event until the data from the BMS arrive. At this moment, reliable information about the current devices status, or at least about the subset of devices, is available. Hence a substantial reduction of the possible ending (terminal) states of the system can be made. Then, all possible traces that end in these allowed terminal states are evaluated in terms of probability, i.e., the search of the maximum probable trajectory is performed. At the end of this process, this maximum probable trajectory determines exactly what devices were turned on or off between two successive readings of control/status signals from the BMS.

At 474, the electric power consumption signature data base is regenerated when an electric power consuming device is upgraded, added, or removed. At 476, the steady-state load component comprises a two dimensional vector comprising a real component and a reactive component. It should be noted that this is a minimum required information input. Embodiments are not limited to the usage of just these two measurement dimensions, and the measured vector can be extended by any other useful measurement that brings additional differentiating information, e.g., by individual phase measurements, or current harmonics.

At 478, the transient component includes a vector that comprises a plurality of real components and a plurality of reactive components. In particular, these components are shifted short signals capturing turn-on events. Turn-off events, indicated by a negative magnitude change of the signal mean, are not very suitable for device differentiation because they usually do not comprise much distinct information. In contrast, a turn-on event may be very specific for each particular device. At 480, the plurality of electric power consumption devices is located downstream of the electric power measuring meter. At 482, the auxiliary data from the building management system comprises control and status signals for one or more devices beyond the measurement point.

Figure 5:
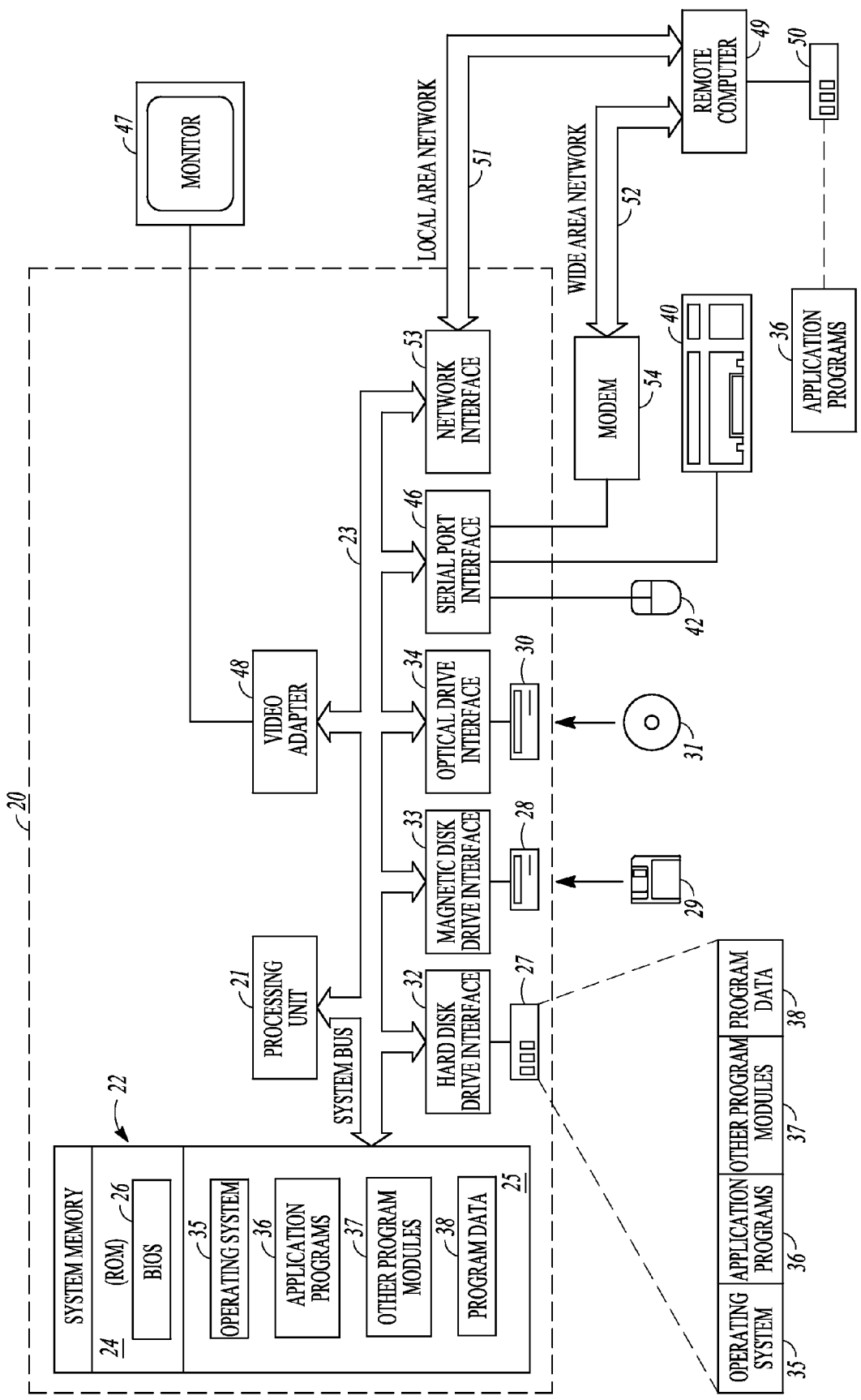
FIG. 5 is a block diagram of a computer system upon which one or more embodiments can execute.

FIG. 5 is an overview diagram of a hardware and operating environment in conjunction with which embodiments of the invention may be practiced. The description of FIG. 5 is intended to provide a brief, general description of suitable computer hardware and a suitable computing environment in conjunction with which the invention may be implemented. In some embodiments, the invention is described in the general context of computer-executable instructions, such as program modules, being executed by a computer, such as a personal computer. Generally, program modules include routines, programs, objects, components, data structures, etc., that perform particular tasks or implement particular abstract data types.

Moreover, those skilled in the art will appreciate that the invention may be practiced with other computer system configurations, including hand-held devices, multiprocessor systems, microprocessor-based or programmable consumer electronics, network PCS, minicomputers, mainframe computers, and the like. The invention may also be practiced in distributed computer environments where tasks are performed by I/O remote processing devices that are linked through a communications network. In a distributed computing environment, program modules may be located in both local and remote memory storage devices.

In the embodiment shown in FIG. 5, a hardware and operating environment is provided that is applicable to any of the servers and/or remote clients shown in the other Figures.

As shown in FIG. 5, one embodiment of the hardware and operating environment includes a general purpose computing device in the form of a computer 20 (e.g., a personal computer, workstation, or server), including one or more processing units 21, a system memory 22, and a system bus 23 that operatively couples various system components including the system memory 22 to the processing unit 21. There may be only one or there may be more than one processing unit 21, such that the processor of computer 20 comprises a single central-processing unit (CPU), or a plurality of processing units, commonly referred to as a multiprocessor or parallel-processor environment. A multiprocessor system can include cloud computing environments. In various embodiments, computer 20 is a conventional computer, a distributed computer, or any other type of computer.

The system bus 23 can be any of several types of bus structures including a memory bus or memory controller, a peripheral bus, and a local bus using any of a variety of bus architectures. The system memory can also be referred to as simply the memory, and, in some embodiments, includes read-only memory (ROM) 24 and random-access memory (RAM) 25. A basic input/output system (BIOS) program 26, containing the basic routines that help to transfer information between elements within the computer 20, such as during start-up, may be stored in ROM 24. The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM or other optical media.

The hard disk drive 27, magnetic disk drive 28, and optical disk drive 30 couple with a hard disk drive interface 32, a magnetic disk drive interface 33, and an optical disk drive interface 34, respectively. The drives and their associated computer-readable media provide non volatile storage of computer-readable instructions, data structures, program modules and other data for the computer 20. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), redundant arrays of independent disks (e.g., RAID storage devices) and the like, can be used in the exemplary operating environment.

A plurality of program modules can be stored on the hard disk, magnetic disk 29, optical disk 31, ROM 24, or RAM 25, including an operating system 35, one or more application programs 36, other program modules 37, and program data 38. A plug in containing a security transmission engine for the present invention can be resident on any one or number of these computer-readable media.

A user may enter commands and information into computer 20 through input devices such as a keyboard 40 and pointing device 42. Other input devices (not shown) can include a microphone, joystick, game pad, satellite dish, scanner, or the like. These other input devices are often connected to the processing unit 21 through a serial port interface 46 that is coupled to the system bus 23, but can be connected by other interfaces, such as a parallel port, game port, or a universal serial bus (USB). A monitor 47 or other type of display device can also be connected to the system bus 23 via an interface, such as a video adapter 48. The monitor 40 can display a graphical user interface for the user. In addition to the monitor 40, computers typically include other peripheral output devices (not shown), such as speakers and printers.

The computer 20 may operate in a networked environment using logical connections to one or more remote computers or servers, such as remote computer 49. These logical connections are achieved by a communication device coupled to or a part of the computer 20; the invention is not limited to a particular type of communications device. The remote computer 49 can be another computer, a server, a router, a network PC, a client, a peer device or other common network node, and typically includes many or all of the elements described above I/O relative to the computer 20, although only a memory storage device 50 has been illustrated. The logical connections depicted in FIG. 5 include a local area network (LAN) 51 and/or a wide area network (WAN) 52. Such networking environments are commonplace in office networks, enterprise-wide computer networks, intranets and the internet, which are all types of networks.

When used in a LAN-networking environment, the computer 20 is connected to the LAN 51 through a network interface or adapter 53, which is one type of communications device. In some embodiments, when used in a WAN-networking environment, the computer 20 typically includes a modem 54 (another type of communications device) or any other type of communications device, e.g., a wireless transceiver, for establishing communications over the wide-area network 52, such as the internet. The modem 54, which may be internal or external, is connected to the system bus 23 via the serial port interface 46. In a networked environment, program modules depicted relative to the computer 20 can be stored in the remote memory storage device 50 of remote computer, or server 49. It is appreciated that the network connections shown are exemplary and other means of, and communications devices for, establishing a communications link between the computers may be used including hybrid fiber-coax connections, T1-T3 lines, DSL's, OC-3 and/or OC-12, TCP/IP, microwave, wireless application protocol, and any other electronic media through any suitable switches, routers, outlets and power lines, as the same are known and understood by one of ordinary skill in the art.

It should be understood that there exist implementations of other variations and modifications of the invention and its various aspects, as may be readily apparent, for example, to those of ordinary skill in the art, and that the invention is not limited by specific embodiments described herein. Features and embodiments described above may be combined with each other in different combinations. It is therefore contemplated to cover any and all modifications, variations, combinations or equivalents that fall within the scope of the present invention.

Thus, an example system for virtual sub-metering using combined classifiers has been described. Although specific example embodiments have been described, it will be evident that various modifications and changes may be made to these embodiments without departing from the broader scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract is provided to comply with 37 C.F.R. §1.72(b) and will allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus the following claims are hereby incorporated into the Description of the Embodiments, with each claim standing on its own as a separate example embodiment.

The invention claimed is:

1. A process comprising:
   generating an electric power consumption signature database by:
      receiving into a computer processor data from an electric power consumption measuring meter and auxiliary data from a building management system; and
      clustering the data; wherein
         the meter is positioned at a measurement point in a building;
         the data relates to aggregate electric power consumption of a plurality of electric power consuming devices in the building; and
         the electric power consumption signature database comprises a steady-state load classification component and a transient shape component;
   after the generation of the electric power consumption signature database:
      receiving into the computer processor additional data from the electric power consumption measuring meter and the auxiliary data from the building management system;
      processing the additional data to generate a second steady-state load classification component;
      extracting a second transient shape component from the additional data; and
      combining the steady-state load classification components and the transient shape components from the electric power consumption signature database, the second steady state load classification component, the second transient shape component, and control signals and status signals associated with the plurality of electric power consuming devices;
   wherein the combining comprises:
      a summation or a product of the steady-state load classification components and the second steady state load classification component;
      a summation or a product of the transient shape components and the second transient shape component;
      a summation or a product of the control signals; and
      a summation or a product of the status signals.

2. The process of claim 1, comprising identifying a particular electric power consuming device as a function of the correlating and combining, wherein the particular electric power consuming device has caused a recent detected event.

3. The process of claim 2, comprising using the identifying of a particular electric power consumption device to monitor the performance of the particular electric power consuming device, to detect a simple fault in the particular electric power consuming device including running out of schedule, and to diagnose a potential problem with the particular electric power consuming device.

4. The process of claim 2, comprising executing a backtracking for making retroactive decisions about a cause of past power events between a last status and control reading and a current status and control data reading.

5. The process of claim 1, wherein the generation of the electric power consumption signature database comprises:
   recording unprocessed data from the electric power consumption measuring meter whenever an abrupt change of a processed power signal is detected, thereby generating the transient shape component;
   processing the data from the electric power consumption measuring meter to remove peaks and noise, thereby improving performance of a successive event detector that generates the steady-state load classification component; and
   statistically clustering the transient shape component and the steady-state load classification component using the auxiliary data from the building management system to generate the electric power consumption signature database.

6. The process of claim 5, comprising receiving into the computer processor, during the generation of the electric power consumption signature database, control signals and status signals from a building management system for the plurality of electric power consuming devices, wherein the control and status signals comprise one or more of an indication when a device is turned on and turned off.

7. The process of claim 1, wherein the generation of the second steady-state load classification component and the second transient shape component comprises:
   recording unprocessed data from the electric power consumption measuring meter whenever an abrupt change of a processed power signal is detected, thereby generating the second transient shape component; and
   processing the data from the electric power consumption measuring meter to remove peaks and noise, and detecting an abrupt change of a mean of the processed power signal and estimating a magnitude of the change, thereby generating the second steady-state load classification component.

8. The process of claim 1, comprising receiving into the computer processor a count of the electric power consuming devices, a nominal power of each of the electric power consuming devices, and combinations of the plurality of electric power consuming devices that are permitted to operate at the same time.

9. The process of claim 1, comprising regenerating the electric power consumption signature data base when an electric power consuming device is upgraded, added, or removed.

10. The process of claim 1, wherein the steady-state load component comprises a two dimensional vector comprising a real component and a reactive component.

11. The process of claim 1, wherein the transient component comprises a vector comprising a plurality of real components and a plurality of reactive components.

12. The process of claim 1, wherein the plurality of electric power consumption devices is located downstream of the electric power measuring meter.

13. The process of claim 1, wherein the auxiliary data from the building management system comprises control and status signals for one or more devices beyond the measurement point.

14. A non-transitory computer readable medium comprising instructions that when executed by a processor execute a process comprising:
   generating an electric power consumption signature database by:
      receiving into a computer processor data from an electric power consumption measuring meter and auxiliary data from a building management system; and
      clustering the data; wherein
         the meter is positioned at a measurement point in a building;
         the data relates to aggregate electric power consumption of a plurality of electric power consuming devices in the building; and
         the electric power consumption signature database comprises a steady-state load classification component and a transient shape component;
   after the generation of the electric power consumption signature database:
      receiving into the computer processor additional data from the electric power consumption measuring meter and the auxiliary data from the building management system;
      processing the additional data to generate a second steady-state load classification component;
      extracting a second transient shape component from the additional data; and
      combining the steady-state load classification components and the transient shape components from the electric power consumption signature database, the second steady state load classification component, the second transient shape component, and control signals and status signals associated with the plurality of electric power consuming devices;
   wherein the combining comprises:
      a summation or a product of the steady-state load classification components and the second steady state load classification component;
      a summation or a product of the transient shape components and the second transient shape component;
      a summation or a product of the control signals; and
      a summation or a product of the status signals.

15. The non-transitory computer readable medium of claim 14, wherein the generation of the electric power consumption signature database comprises instructions for:
   recording unprocessed data from the electric power consumption measuring meter whenever an abrupt change of a processed power signal is detected, thereby generating the transient shape component;
   processing the data from the electric power consumption measuring meter to remove peaks and noise, thereby improving performance of a successive event detector that generates the steady-state load classification component; and
   statistically clustering the transient shape component and the steady-state load classification component using the auxiliary data from the building management system to generate the electric power consumption signature database.

16. The non-transitory computer readable medium of claim 14, wherein the generation of the second steady-state load classification component and the second transient shape component comprises instructions for:
- recording unprocessed data from the electric power consumption measuring meter whenever an abrupt change of a processed power signal is detected, thereby generating the second transient shape component; and
- processing the data from the electric power consumption measuring meter to remove peaks and noise, and detecting an abrupt change of a mean of the processed power signal and estimating a magnitude of the change, thereby generating the second steady-state load classification component.

17. The non-transitory computer readable medium of claim 14, comprising instructions for using the identifying of a particular electric power consumption device to monitor the performance of the particular electric power consuming device, to detect a fault in the particular electric power consuming device, and to diagnose a potential problem with the particular electric power consuming device.

18. The non-transitory computer readable medium of claim 14, comprising instructions for executing a backtracking for making retroactive decisions about a cause of past power events between a last status and control reading and a current status and control data reading.

19. A system comprising one or more computer hardware processors and hardware memory configured for:
- generating an electric power consumption signature database by:
  - receiving into a computer processor data from an electric power consumption measuring meter and auxiliary data from a building management system; and
  - clustering the data; wherein
    - the meter is positioned at a measurement point in a building;
    - the data relates to aggregate electric power consumption of a plurality of electric power consuming devices in the building; and
    - the electric power consumption signature database comprises a steady-state load classification component and a transient shape component;
- after the generation of the electric power consumption signature database:
  - receiving into the computer processor additional data from the electric power consumption measuring meter and the auxiliary data from the building management system;
  - processing the additional data to generate a second steady-state load classification component;
  - extracting a second transient shape component from the additional data; and
  - combining the steady-state load classification components and the transient shape components from the electric power consumption signature database, the second steady state load classification component, the second transient shape component, and control signals and status signals associated with the plurality of electric power consuming devices;
- wherein the combining comprises:
  - a summation or a product of the steady-state load classification components and the second steady state load classification component;
  - a summation or a product of the transient shape components and the second transient shape component;
  - a summation or a product of the control signals; and
  - a summation or a product of the status signals.

20. The system of claim 19, wherein the generation of the electric power consumption signature database comprises:
- recording unprocessed data from the electric power consumption measuring meter whenever an abrupt change of a processed power signal is detected, thereby generating the transient shape component;
- processing the data from the electric power consumption measuring meter to remove peaks and noise, thereby improving performance of a successive event detector that generates the steady-state load classification component; and
- statistically clustering the transient shape component and the steady-state load classification component using the auxiliary data from the building management system to generate the electric power consumption signature database; and
- wherein the generation of the second steady-state load classification component and the second transient shape component comprises:
- recording unprocessed data from the electric power consumption measuring meter whenever an abrupt change of a processed power signal is detected, thereby generating the second transient shape component; and
- processing the data from the electric power consumption measuring meter to remove peaks and noise, and detecting an abrupt change of a mean of the processed power signal and estimating a magnitude of the change, thereby generating the second steady-state load classification component.

* * * * *